(12) United States Patent
Sandquist et al.

(10) Patent No.: US 6,445,171 B2
(45) Date of Patent: Sep. 3, 2002

(54) CLOSED-LOOP MAGNETORESISTIVE CURRENT SENSOR SYSTEM HAVING ACTIVE OFFSET NULLING

(75) Inventors: David A. Sandquist, St. Paul; James E. Lenz, Brooklyn Park; Dale F. Berndt, Plymouth, all of MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/430,468

(22) Filed: Oct. 29, 1999

(51) Int. Cl.$^7$ ............ G01R 33/00; G01R 7/00; G01R 25/00; A61N 1/08
(52) U.S. Cl. ............ 324/117 R; 324/142; 324/76.77; 607/66
(58) Field of Search ............ 324/117 R, 142, 324/127, 107, 111, 76.77

(56) References Cited

U.S. PATENT DOCUMENTS

| | | | | | |
|---|---|---|---|---|---|
| 3,482,163 A | * | 5/1967 | Peek et al. | ............... | 324/117 R |
| 3,959,724 A | * | 5/1976 | Chana et al. | ............... | 324/142 |
| 4,096,436 A | * | 6/1978 | Cook et al. | ............... | 324/142 |
| 4,255,705 A | * | 3/1981 | Milkovic | ............... | 324/127 |
| 4,356,446 A | * | 10/1982 | Battocletti | ............... | 324/76.77 |
| 4,395,677 A | * | 7/1983 | Petersdorf | ............... | 324/117 H |
| 4,482,862 A | * | 11/1984 | Leehey | ............... | 324/117 R |
| 4,682,101 A | * | 7/1987 | Cattaneo | ............... | 324/127 |
| 4,754,219 A | * | 6/1988 | Milkovic | ............... | 324/142 |
| 4,823,075 A | * | 4/1989 | Alley | ............... | 324/117 H |
| 4,905,117 A | * | 2/1990 | Beg | ............... | 361/93.6 |
| 4,961,049 A | | 10/1990 | Ghislanzoni | | |
| 5,049,809 A | * | 9/1991 | Wakatsuki et al. | ............... | 324/117 R |
| 5,196,784 A | * | 3/1993 | Estes, Jr. | ............... | 324/117 R |
| 5,293,121 A | * | 3/1994 | Estes, Jr. | ............... | 324/117 R |
| 5,416,427 A | * | 5/1995 | Tracewell | ............... | 324/754 |
| 5,438,257 A | * | 8/1995 | Berkcan | ............... | 324/117 R |
| 5,632,092 A | * | 5/1997 | Blank et al. | ............... | 33/361 |
| 5,719,494 A | * | 2/1998 | Dettmann et al. | ............... | 324/117 R |
| 5,726,571 A | * | 3/1998 | Guclu et al. | ............... | 324/322 |
| 6,008,643 A | * | 12/1999 | Mani et al. | ............... | 324/251 |
| 6,029,090 A | * | 2/2000 | Herbst | ............... | 607/66 |

FOREIGN PATENT DOCUMENTS

EP 0286079 A 10/1988

OTHER PUBLICATIONS

Article "A New Perspective on Magnetic Field Sensing", Michael J. Caruso and Tamara Bratland, Honeywell, SSEC, Carl H. Smith and Robert Schneider, Nonvolatile Electronics, Inc., Sensors Dec. 1998.

Article "Anisotropic Magnetoresistive Sensors: Theory and Applications", Michael J. Caruso and Tamara Bratland, Honeywell, SSEC, Carl H. Smith and Robert Schneider, Nonvolatile Electronics, Inc., Sensors Mar. 1999.

* cited by examiner

Primary Examiner—N. Le
Assistant Examiner—Wasseem H. Hamdan
(74) Attorney, Agent, or Firm—Andrew A. Abeyta; Brian N. Tufte; John G. Shudy, Jr.

(57) ABSTRACT

A magnetoresistive sensor system having resistive elements changing in ohmic value in the presence of a magnetic field of a current being measured. The variant values of the elements are amplified by some electronics that inherently add offset to the resultant values. The elements themselves also add an offset. The output of the electronics is modulated and then buffered as an output.

This output is demodulated integrated. The resultant signal is fed back to the input of the electronics to null out the offsets. The output of the buffer also goes to an inductive coil that is magnetically coupled to the resistive elements to null out the magnetic field from the current being measured. The buffer output indicates the magnitude of the current being measured. An oscillator outputs a signal to actuate the modulator and the demodulator. The oscillator signal also goes to a set/reset circuit for setting and resetting the resistive elements of the magnetoresistive sensor.

56 Claims, 3 Drawing Sheets

CLOSED-LOOP MAGNETORESISTIVE CURRENT SENSOR SYSTEM HAVING ACTIVE OFFSET NULLING

The invention pertains to current sensors and particularly to magnetoresistive (MR) current sensors. More particularly, it pertains to MR sensors having low offsets.

SUMMARY OF THE INVENTION

The present current sensor is a closed-loop, non-contact, fast-responding, wide-bandwidth, field nulling current sensor. This sensor reveals parameters equivalent to other closed-loop approaches such as the closed loop Hall effect current sensor in the related art. It is the use of the MR sensor having a set/reset and offset nulling loop leads to ultra low offsets and ultra low offset drifts over all conditions in current measurement. It also has very low offset drift over wide ranges of operating temperatures. Because of the ultra low offset, the sensor provides very accurate measurements of current. It has an auto-zero offset reduction circuit, which has a separate feedback path to remove offset and offset drift from the circuit. The magnetic signal and offset signals are driven to their respective nulls by independent feedback loops. The offset feedback loop is not used in Hall effect type current sensors. The transient noise and spikes caused by the set/reset circuit are greatly reduced with this new feedback scheme. The sensor has a frequency response from DC to over 150 kHz and has a response time of less than one microsecond.

DESCRIPTION OF THE EMBODIMENT

Figure 1:
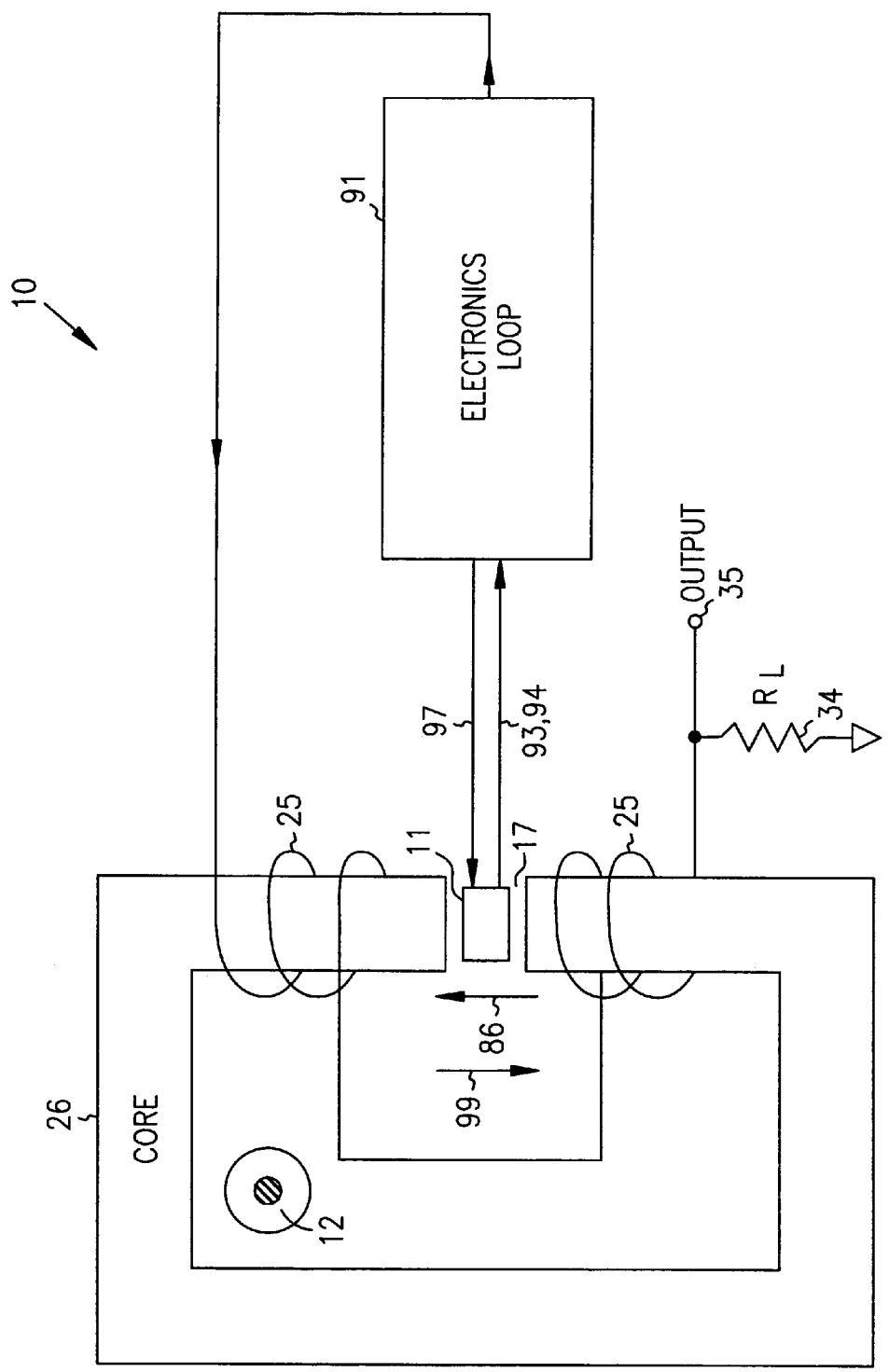
FIG. 1 is an illustration of an MR closed loop current sensing system.

An overview of a closed loop MR current sensor system 10 is shown in FIG. 1. Input primary current 12 can be in a conductor having one to N turns, where N can be any practical number. The magnetic flux 86 from current 12 of the primary current carrying conductor is concentrated by a high permeability core 26 and dropped across a gap 17 to produce a magnetic field 86. An inductive feedback or rebalance coil 25 produces a magnetic field 99 to oppose magnetic field 86. MR die 11 senses the difference between magnetic fields 86 and 99. The output of MR die 11 is amplified, among other things, by an electronics loop 91, which includes an operational amplifier electronics 30, demodulator 31, buffer amplifier electronics 32, set/reset circuit 90, modulator 36 and integrator 37. Electronics loop 91, along with coil 25, drives magnetic field 86 in gap 17 to a null value with a magnetic field 99. A path 97 provides set/reset signals to MR die 11. Circuit 90 sets and resets or rotates the magnetic vector of MR die 11 180 degrees at a 1 kHz rate. This technique is used to produce an ultra low offset current sensor 10. Gap 17 is small relative to the core 26 cross-section and length to provide better accuracy and improved shielding from stray external magnetic fields.

Figure 2:
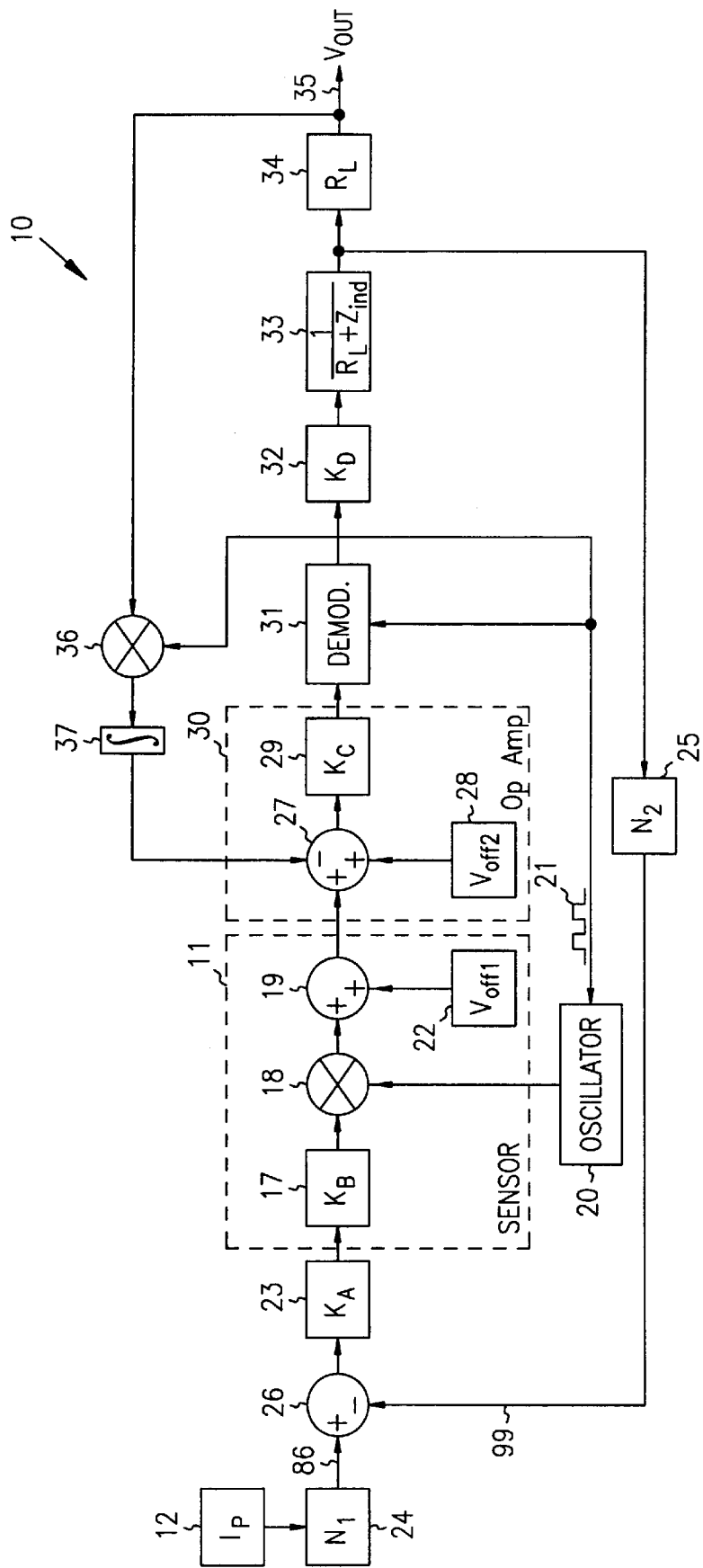
FIG. 2 is a functional diagram of the MR current sensing system.
Figure 3:
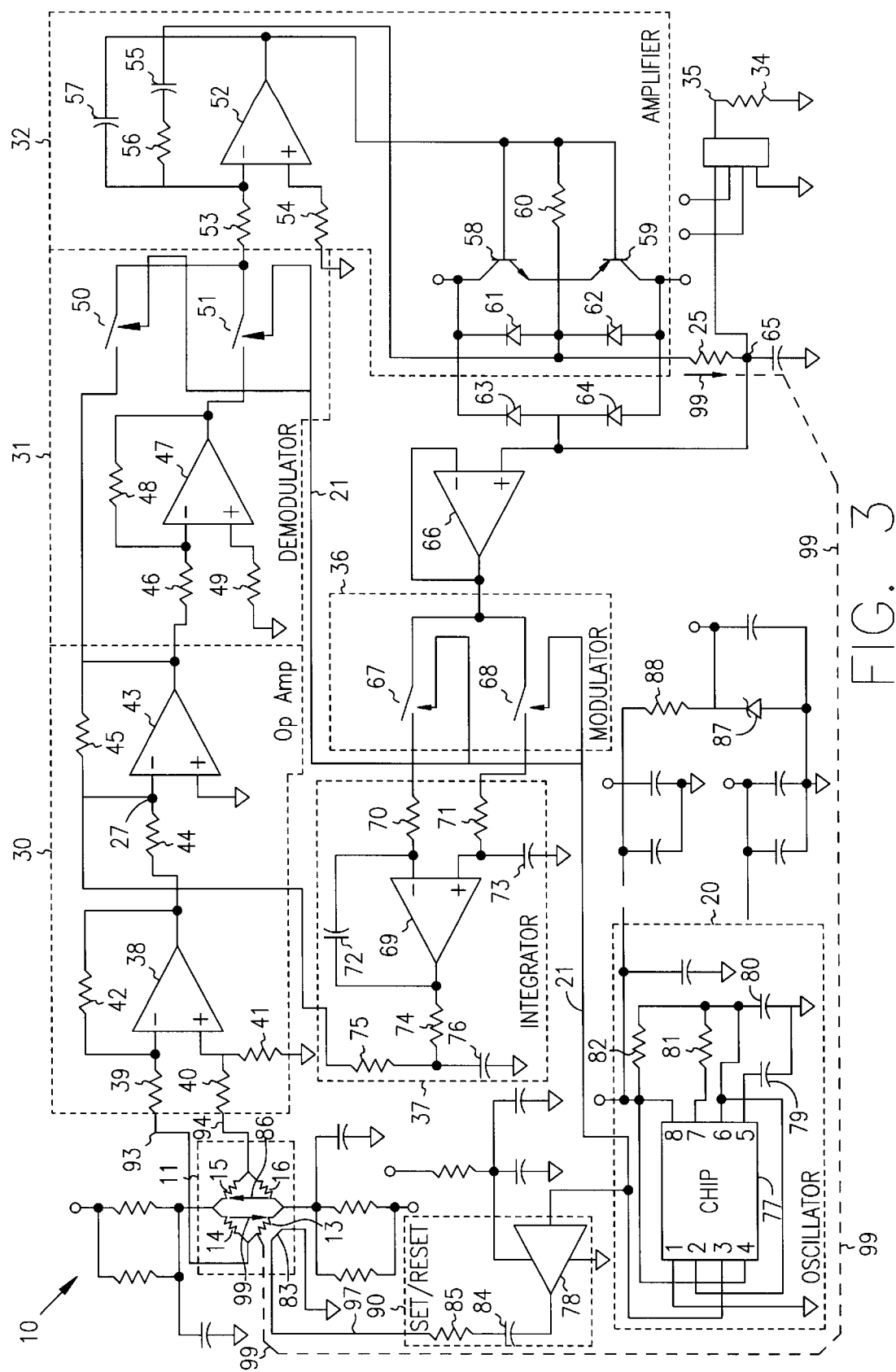
FIG. 3 is a schematic of the MR current sensing system.

A conceptual layout of MR sensor system 10 is shown in FIG. 2. System 10 has an anisotropic MR Wheatstone bridge 11 next to a conductor(s) carrying a current 12 that generates a magnetic field 86. This magnetic field is typically concentrated across MR sensor 11 through use of a magnetic core 26. In FIG. 3, MR sensor 11 is comprised of four Permalloy (NiFe) resistors 13–16 that are connected end to end, and the magnetic field 86 (B) of current 12 and 99 of rebalance coil 25 changes the resistance of resistors 13, 14, 15 and 16. In the set/reset process, a high current (unrelated to the current being measured or the current being fed back) pulse is sent through the set/reset strap by a MOSFET driver 78. This "sets" the magnetization of the Permalloy in one direction such that a positive magnetic field (generated by the conductor or feedback coil or any other field source) will cause the resistance of two resistors to increase and the other two resistors to decrease. If a pulse of equal amplitude but opposite direction is then sent through the set/reset strap, this is a "reset" condition and each resistor will change resistance opposite to the set condition. The set/reset process and the magnetization of the Permalloy are independent of the conductor with current that is being measured. Resistors 13 and 15 increase in resistance for a first direction of current 12 flow and resistors 14 and 16 decrease in the set condition. For the first direction of current 12 flow, resistors 13 and 15 decrease and resistors 14 and 16 increase in resistance in the reset condition. The resistance changes are proportional to the magnitude of the current 12 flow. Current 12 may have its magnitude measured in amperes and the magnetic field measured in Gauss. $K_B$ 17 is a transfer function inherent to sensor 11. Function 17 represents the effect of the magnetic field 86 of current 12 (and the field 99 generated inductive feedback coil 25) on the resistors of sensor 11. Modulator or multiplier 18 of FIG. 2 is where the set/reset signal comes to sensor 11 from an oscillator 20. The signal is a one kHz square wave 21. The signal may be another kind of signal and/or have a different frequency. Summer 19 conceptually represents the superposition of a $V_{off1}$ (MR offset voltage) to an output signal of sensor 11. $K_A$ 23 represents the transfer function for a gap in core 26, which may be given in ampere-turns a device having $N_1$ 24 turns in the first winding, which is the current 12 carrying wire. $N_2$ 25 represents the number of turns of the second winding (inductive feedback coil), which couples the negative magnetic feedback (99) to sensor 11. The feedback coil has about 1000 turns. The magnetic core superposes the magnetic fields (99 and 86) from the feedback coil 25 and the current 12, therefore it is represented by summer 26.

The output of sensor 11 goes to a summer 27 which adds an offset $V_{off2}$ 28 of the operational amplifier electronics 30 and the voltage offset feedback to the output signal of sensor 11 to cancel the offsets. $K_C$ 29 represents the transfer function, such as gain, of the operational amplifier electronics 30. The output of electronics 30 goes to demodulator 31 to be demodulated. Items 46–49 are actually a part of demodulator 31. An input signal 21 from oscillator 20 sets the demodulator 31 frequency. The demodulator sensor signal goes on to $K_D$ 32, which is the transfer function of the final operational or current buffer amplifier electronics 32 for sensor system 10. It has a large gain at DC and rolls off at above 1 kHz. The output goes to a transfer function 33 of the inverse of the sum of the load resistance $R_L$ 34 of system 10 and the inductive impedance $(R_{ind}+j\omega L_{ind})$ of winding or coil 25. $Z_{ind}=(R_{ind}+j\omega L_{ind})$, where $Z_{ind}$ is the impedance of the inductive feedback coil which is the sum of the inductive coil's resistance $(R_{ind})$ and reactance $(j\omega L_{ind})$ where $L_{ind}$ is the inductive coil's inductance. The output of the current sensor is given in current and is typically run through a load (RL) to measure a voltage out. An offset feedback signal from output 35 goes to a modulator 36. This offset feedback signal could also come from the output of 33 (tied after 32 on the schematic). Signal 21 from oscillator 20 actuates modulator 36. The modulated offset feedback signal goes to an integrator 37 that provides the integrated voltage offset feedback signal (DC) to summer 27 of operational amplifier electronics 30 with the modulated signal level at about 1 kHz filtered.

FIG. 3 is a schematic of sensor system 10. Sensor 11 has the Wheatstone bridge of resistors 13–16, connected end-to-end as described above. The bridge outputs go to the inverting and non-inverting inputs, respectively, via conductors 93 and 94 and 4.02K ohm resistors 39 and 40, of differential amplifier 38 of operational amplifier electronics 30. A 40.2 K ohm resistor 41 connects the non-inverting input to ground, and a 40.2 K feedback resistor 42 connects the output of amplifier 38 to its inverting input. The output of amplifier 38 goes to the inverting input of amplifier 43 via a 4.02 K ohm resistor 44. The output of amplifier 43 is connected to its inverting input via a 40.2 K ohm resistor 45. The non-inverting input of amplifier 43 is connected to ground. A resistor to ground is not necessary here (for this op-amp only) since any offset because of mis-matched input resistance is removed by the offset feedback. This removes one resistor. The output goes to the inverting input of amplifier 47 of demodulator 31, via a 4.02 K ohm resistor 46. The output is connected to the inverting input via a 4.02 K ohm resistor 48. The non-inverting input is connected to ground via a 2 K ohm resistor 49. Operational amplifiers 38, 43 and 47 are BA4560 amplifiers, although many other models could be used.

An input to a first terminal of a normally open switch 50 of demodulator 31 is connected to the output of amplifier 43. An input to a first terminal of a normally closed switch 51 is connected to the output of inverting amplifier 47. The output terminals of switches 50 and 51 are connected to the inverting input of amplifier 52 of output buffer electronics 32, via a 2 K ohm resistor 53. The actuators of switches 50 and 51 of demodulator 31 are actuated with signal 21 from oscillator 20. Switches 50 and 51 of demodulator 31 are in an ADG413 quad SPST analog switch device.

The non-inverting input of amplifier 52 is connected to ground via a 2 K ohm resistor 54. The output of amplifier 52 is connected to its inverting input via a 56 picofarad capacitor 57. This connection arrangement may be varied depending on the stability of the amplifier 52. The output of amplifier 52 goes to the bases of NPN buffer output transistor 58 and PNP buffer output transistor 59. The collectors of transistors 58 and 59 are connected to +15 volts and −15 volts, respectively. The emitters of transistors 58 and 59 are connected together, and are connected to the output of amplifier 52 via a 316 ohm resistor 60. The common emitter connection of transistors 58 and 59 is the output of buffer electronics 32. This output is connected to the inverting input of amplifier 52 via a 0.033 microfarad capacitor 55 and a 5.11 K ohm resistor 56 connected in series. A diode 61 has a cathode and an anode connected to the collector and emitter, respectively, of transistor 58. A diode 62 has a cathode and an anode connected to the emitter and collector, respectively, of transistor 59. Amplifier 52 is a BA4560 device; transistor 58 is a BCX55 device; and transistor 59 is a BCX52 device.

The output of first buffer electronics 32 is connected to a first terminal of winding 25. Winding 25 provides the magnetic feedback to MR sensor 11 via a magnetic core 26 and gap 23. Core 26 and gap 23 are represented in FIG. 2 but not shown in FIG. 3. A second terminal of winding 25 is connected to the anode of diode 63 and the cathode of diode 64. The cathode of diode 63 is connected to the collector of transistor 58. The anode of diode 64 is connected to the collector of transistor 59. Diodes 61, 62, 63 and 64 function as voltage clamps for circuit protection.

The second terminal of winding 25 is the current output 65 of sensor system 10. Output 65 is connected to ground via a 4,700 picofarad capacitor. Output 65 is connected to one end of a 100 ohm RL resistor 34. The other end of resistor 34 is connected to ground. This is the resistor used here, but the customer usually chooses this value. It can be anything from zero to one megohm, although the device does not operate over its full range of current with larger resistors. Voltage output 35 across resistor 34 is the indication of the amount of current 12 flowing through the wire proximate to MR sensor 11. Also, output 65 is connected as an offset feedback signal to the non-inverting input of a buffer amplifier 66. Amplifier 66 is an LT1013 device. Although the LT1013's low offset and offset drift properties are not required, it is used as this buffer versus a cheaper amplifier because it is a spare on the chip anyway.

The output of amplifier 66 is connected to its inverting input and to input terminals of a normally open switch 67 and a normally closed switch 68. Switches 67 and 68 are of modulator 36. Actuators of switches 67 and 68 are actuated by signal 21 from oscillator 20. The output terminals of switches 67 and 68 are connected to the inverting and non-inverting inputs of an amplifier 69 of integrator 37 via 24.9 K ohm resistors 70 and 71, respectively. Amplifier 69 is an LT1013 device. A 0.47 microfarad capacitor connects the output of amplifier 69 to its inverting input. A 0.47 capacitor 73 connects the non-inverting input of amplifier 69 to ground. The output of amplifier 69 is connected to a summer 27 point at the non-inverting input of amplifier 43, via 46.4 K ohm resistors 74 and 75. The inter-connection of resistors 74 and 75 is connected to ground through a 0.47 microfarad capacitor 76. The signal from amplifier 69 to the summer 27 point is a voltage offset signal that is used for nulling out offset signals ($V_{off1}$) 22 in MR sensor 11 and offset signals ($V_{off2}$) of amplifier electronics 30.

Demodulator 31 and modulator 36 have normally open switches 50 and 67, and normally closed switches 51 and 68. The switches, as noted above, are paired off in demodulator 31 and modulator 36. In each pair, one switch is open and one switch is closed at any one given time period. All of the four switches 50, 51, 67 and 68 are actuated by clock pulse 21. Since the sensed signal was modulated in MR sensor 11 at one kHz, demodulator 31 demodulates the signal back down to DC (and modulates DC signals up to one kHz). Switches 67 and 68 take one kHz square wave 21 and alternately switch the incoming signal to the non-inverting and the inverting inputs of operational amplifier 69. This in effect modulates any DC signal and demodulates a one kHz signal. Amplifier 69 then acts as an integrator to pass the DC signal as feedback to operational amplifier electronics 30. Resistors 74 and 75 and capacitor 76 also act to filter this voltage.

The set/reset mechanism 90 for MR sensor 11 is initiated by a signal 21 from oscillator 20. Oscillator 20 consists of an LM555 chip 77 with a terminal 1 to ground. A terminal 2 is connected to threshold terminal 6 that is connected to ground via a 0.01 microfarad capacitor 80 and to VCC (+5 volts DC) via a 49.9 K ohm resistor 82. An output terminal 3 provides about one kHz square wave output 21 to the input of a high speed MOSFET driver 78. Also, chip 77 has a reset terminal 4 connected to VCC(+5 Volts DC), and a control terminal 5 connected to ground via a 0.01 microfarad capacitor 79. Discharge terminal 7 is connected to terminal 6 via a 21.5 k ohm resistor 81. VCC terminal 8 is connected to +5 volts DC.

The output of set/reset driver 78 is connected to set/reset coil or strap 83 of MR sensor 11, via a 0.01 microfarad capacitor 84 and an eight ohm resistor 85 connected in series.

Associated with the power supply, there are a 5.1 volt Zener diode 87 and 2 K resistor 88 tied between ground and +15 volts. This creates a 5 volt supply for switched 67, 68, 50 and 51 (through Vp) and device 77. The approach creates a 5 volt supply, and improves performance over the tying those pins to +15 volts. This configuration decreases the "glitches" on the output each time the set or reset occurs, for the price of two low-cost components.

Although the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A magnetoresistive current sensor system comprising:
   a magnetoresistive sensor having an output;
   operational amplifier electronics having an input connected to the output of said magnetoresistive sensor, and having an output;
   a demodulator having an input connected to the output of said operational amplifier electronics, and having an output;
   output buffer having an input connected to the output of said demodulator, and having an output;
   a coil, magnetically coupled to said magnetoresistive sensor and connected to the output of said output buffer;
   a modulator having an input connected to the output of said output buffer; and
   an integrator having an input connected to the output of said modulator and having an output connected to said operational amplifier electronics.

2. The sensor system of claim 1, wherein:
   a first offset voltage is at the output of said magnetoresistive sensor;
   a second offset voltage and the first offset voltage are at the output of said operational amplifier electronics; and
   an offset voltage feedback signal from the output of said integrator nulls out the first and second offset voltages.

3. The sensor system of claim 2, wherein:
   a magnetic signal, having a magnitude, from said coil to said magnetoresistive sensor, magnetically nulls out a magnetic field sensed by said magnetoresistive sensor; and
   the magnitude of the coil's magnetic signal is indicative of a magnitude of the magnetic field sensed by said magnetoresistive sensor.

4. The sensor system of claim 3, further comprising:
   at least one conductor proximate to said magnetoresistive sensor; and
   wherein said at least one conductor conducts a current that radiates the magnetic field sensed by said magnetoresistive sensor.

5. The sensor system of claim 4, wherein the magnitude of a signal at the output buffer is indicative of the magnitude of the current.

6. The sensor system of claim 4, further comprising:
   a set/reset circuit connected to said magnetoresistive sensor; and
   an oscillator outputting a clock signal; and
   wherein:
   the clock signal goes to said set/reset circuit;
   said set/reset circuit sets and resets said magnetoresistive sensor;
   the clock signal goes to said demodulator to actuate said demodulator; and
   the clock signal goes to said modulator to actuate said modulator.

7. The sensor system of claim 4, wherein;
   said magnetoresistive sensor is a Wheatstone bridge of resistors; and
   said resistors are Permalloy (NiFe) resistors.

8. A magnetoresistive sensor system comprising:
   a magnetoresistive sensor;
   a conductor proximate to said magnetoresistive sensor;
   a first amplifier connected to said magnetoresistive sensor;
   a demodulator connected to said first amplifier;
   a second amplifier connected to said demodulator;
   a coil, coupled to said magnetoresistive sensor and connected to said second amplifier;
   a modulator connected to said second amplifier; and
   an integrator connected to said modulator and to said first amplifier.

9. The sensor system of claim 8, wherein said integrator outputs a first signal to null out an offset voltage, if any, of said magnetoresistive sensor.

10. The sensor system of claim 9, wherein said integrator outputs a second signal to null out an offset voltage, if any, of said first amplifier.

11. The sensor of claim 10, wherein:
    said coil couples a magnetic signal to said magnetoresistive sensor to null out a magnetic field of a current in said conductor, sensed by said magnetoresistive sensor; and
    a magnitude of the magnetic signal is indicative of a magnitude of the current in said conductor.

12. The sensor of claim 11, further comprising:
    a set/reset circuit connected to said magnetoresistive sensor; and
    an oscillator connected to said modulator, said demodulator, and said set/reset circuit.

13. A magnetoresistive current sensor system comprising:
    a magnetoresistive sensor;
    an amplifier connected to said magnetoresistive sensor;
    a modulator connected to said amplifier;
    a buffer connected to said modulator;
    a modulator connected to said buffer;
    an integrator connected to said modulator and said amplifier; and
    an inductive device coupled to said magnetoresistive sensor and connected to said buffer.

14. The system of claim 13, further comprising:
    a set/reset circuit connected to said magnetoresistive sensor; and
    a signal generator connected to said modulator, demodulator and set/reset circuit.

15. A means for sensing current with offset nulling, comprising:
    sensor means for magnetoresistively sensing a magnetic field;

amplifier means for amplifying signals from said sensor means;

modulator means for modulating signals from said amplifier means;

buffer means for buffering signals from said modulator means;

demodulator means for demodulating signals from said buffer means; and integrator means for integrating signals from said demodulator means, and adding integrated signals to said amplifier means.

16. The means for sensing current of claim 15, wherein the integrated signals null out offsets from said sensor means.

17. The means for sensing current of claim 16, wherein the integrated signals null out offsets from said amplifier means.

18. The means for sensing current of claim 17, further comprising magnetic feedback means for providing signals from said buffer means to said sensor means to null out the magnetic field sensed by said sensing means.

19. The means for sensing current of claim 18, further comprising a set/reset means for setting and resetting said sensor means.

20. The means for sensing current of claim 19, further comprising a generator means for generating a signal for said modulator means, demodulator means and set/reset means.

21. A current sensor system for sensing an input current, the input current generating an input magnetic field, the current sensor system comprising:

a magnetic field sensor for sensing the input magnetic field, and for providing a sensor output signal that is a function of said magnetic field, the sensor output signal having a sensor offset component;

means for detecting the sensor offset component of the sensor output signal;

means for a least partially removing the sensor offset component; and means for generating a nulling magnetic field at the magnetic field sensor, the nulling magnetic field substantially nulling out the input magnetic field generated by said input current, the nulling current being related to the input current.

22. A current sensor system according to claim 21 wherein said means for generating the nulling magnetic field includes circuitry with one or more circuit offsets.

23. A current sensor system according to claim 22 further comprising means for at least partially removing the one or more circuit offsets.

24. A current sensor system according to claim 23 wherein said means for at least partially removing the one or more circuit offsets includes a feedback path having an integrator.

25. A current sensor system according to claim 24 wherein said means for at least partially removing the one or more circuit offsets further includes a demodulator and a modulator.

26. A current sensor system according to claim 21 wherein the magnetic field sensor includes a magnetoresistive sensor.

27. A current sensor system according to claim 26 wherein the magnetoresistive sensor includes at least two magnetoresistive elements connected in a bridge configuration.

28. A current sensor system according to claim 27 further comprising a set/reset strap positioned in proximity to the magnetoresistive elements.

29. A current sensor according to claim 28 wherein said means for detecting the sensor offset component includes a set/reset means for providing an alternating set/reset signal to the set/reset strap.

30. A current sensor according to claim 29 wherein the set/reset strap is positioned relative to the magnetoresistive elements so that the alternating set/reset signal alternately sets the magnetization of at least one magnetoresistive element in a first direction and at least one other magnetoresistive element in a second opposite direction, and then sets the magnetization of at least one magnetoresistive element in the second opposite direction and the at least one other magnetoresistive element in the first direction.

31. A curret sensor system according to claim 29 wherein the alternating set/reset signal is provided by an oscillator.

32. A current sensor system according to claim 31 wherein said means for at least partially removing the sensor offset component includes a feedback path having a demodulator and a modulator.

33. A current sensor system according to claim 31 wherein said means for at least partially removing the sensor offset component includes a feedback path having an integrator.

34. A magnetoresistive current sensor system for noncontact sensing of an impact current, the input current producing an input magnetic field, said system comprising:

a magnetoresistive sensor for sensing the input magnetic field and for generating a sensor signal in response to said input magnetic field;

amplification circuitry for amplifying said sensor signal to generate an amplified sensor signal;

a first feedback loop for feeding back an offset feedback signal, the offset feedback signal removing an offset in said amplified sensor signal, the offset including offset components associated with said amplification circuitry and an offset component associated with said magnetoresistive sensor; and a second feedback loop for feeding back a nulling current in proximity of said magnetoresistive sensor, the nulling current producing a nulling magnetic field that substantially nulls out the input magnetic field, said nulling current being a function of said amplified sensor signal.

35. A magnetoresistive current sensor system of claim 34, wherein said sensor signal is modulated by a set/reset circuit prior to inputting said sensor signal to said amplification circuitry.

36. A magnetoresistive current sensor system of claim 35, wherein said first feedback loop includes an integrator.

37. A magnetoresistive current sensor system according to claim 35 wherein the magnetoresistive sensor includes at least two magnetoresistive elements connected in a bridge configuration.

38. A magnetoresistive current sensor system according to claim 37 wherein the set/reset circuit includes a set/reset strap positioned in proximity of the magnetoresistive elements.

39. A magnetoresistive current sensor system according to claim 38 wherein said set/reset circuit provides an alternating set/reset signal to the set/reset strap.

40. A magnetoresistive current sensor system according to claim 39 wherein the set/reset strap is configured relative to the magnetoresistive elements so that the alternating set/reset signal alternately sets the magnetization of at least one magnetoresistive element in a first direction and at least one other magnetoresistive element in a second opposite direction, and then sets the magnetization of the at least one magnetoresistive element in the first direction, said alternating set/reset signal thus modulating the sensor output signal.

41. The magnetoresistive current sensor system of claim 40, wherein said set/reset circuit includes an oscillator for providing the alternating set/reset signal.

42. The magnetoresistive current sensor system of claim 40, wherein said first feedback path includes:
an integrator for integrating the modulated sensor output signal to produce an integrated sensor output signal, the integrated sensor output signal having a component related to the sensor offset; and
a subtractor for subtracting at least a portion of the integrated sensor output signal from the modulated sensor output signal.

43. The magnetoresistive current sensor system of claim 42 wherein the integrator integrates an amplified version of a modulated sensor output signal.

44. The magnetoresistive current sensor system of claim 40, wherein said amplification circuitry includes at least one operational amplifier and a demodulator.

45. The magnetoresistive current sensor system of claim 44, wherein said amplification circuitry further includes a modulator and an integrator.

46. A method for sensing an input current, the input current providing an input magnetic field, the method comprising:
sensing the input magnetic field, and providing a sensor output signal that is a function of said input magnetic field, the sensor output signal having a sensor offset component;
detecting the sensor offset component of the sensor output signal;
providing compensation for the detected sensor offset component; and
generating a nulling magnetic field at the magnetic field sensor, the nulling magnetic field produced by a nulling current that substantially nulls out the input magnetic field generated by said input current, the nulling current being related to the input current.

47. A method according to claim 46 wherein the nulling current includes one or more circuit offsets.

48. A method according to claim 47 further comprising the step of providing compensation for the one or more of the circuit offsets.

49. A method according to claim 48 wherein the one or more circuit offsets are compensated by:
modulating the nulling current, thereby resulting in a modulated nulling current;
integrating the modulated nulling current, thereby resulting in an integrated nulling feedback signal, the integrated nulling feedback signal including a component that is related to the one or more circuit offsets;
subtracting at least a portion of the integrated nulling feedback signal from the nulling current; and
demodulating the nulling current.

50. A method according to claim 46 wherein the input magnetic field is sensed using a magnetoresistive sensor.

51. A method according to claim 50 wherein the magnetoresistive sensor includes at least two magnetoresistive elements connected in a bridge configuration.

52. A method according to claim 51 further comprising providing an alternating set/resent current adjacent the at least two magnetoresistive elements.

53. A method according to claim 52 wherein the alternating set/reset signal alternately sets the magnetization of at least one magnetoresistive element in a first direction and at least one other magnetoresistive element in a second opposite direction, and then sets the magnetization of the at least one magnetoresistive element in the second opposite direction and the at least one other magnetoresistive element in the first direction.

54. A method according to claim 53 wherein the alternating set/reset signal modulates the sensor output signal.

55. A method according to claim 54 wherein the alternating set/reset current is provided by an oscillator.

56. A method according to claim 54 wherein the detected sensor offset component is compensated for by:
integrating the modulated sensor output signal, thereby resulting in an integrated sensor output signal, the integrated sensor output signal including a component that is related to the sensor offset; and
subtracting at least a portion of the integrated sensor output signal from the sensor output signal.

* * * * *